United States Patent [19]

Baliga

[11] Patent Number: 5,323,040
[45] Date of Patent: Jun. 21, 1994

[54] SILICON CARBIDE FIELD EFFECT DEVICE

[75] Inventor: Bantval J. Baliga, Raleigh, N.C.

[73] Assignee: North Carolina State University at Raleigh, Raleigh, N.C.

[21] Appl. No.: 127,309

[22] Filed: Sep. 27, 1993

[51] Int. Cl.$^5$ .................. H01L 29/10; H01L 29/78; H01L 29/161

[52] U.S. Cl. .................. 257/332; 257/77; 257/331; 257/334; 257/344

[58] Field of Search .................. 257/77, 329, 330, 331, 257/332, 334, 344

[56] References Cited

U.S. PATENT DOCUMENTS

| 4,903,189 | 2/1990 | Ngo et al. | 363/127 |
| 5,202,750 | 4/1993 | Gough | 257/133 |

FOREIGN PATENT DOCUMENTS

| 0494597A1 | 7/1992 | European Pat. Off. | |
| 63-102271 | 5/1988 | Japan | 257/329 |
| WO89/4056 | 5/1989 | PCT Int'l Appl. | 257/77 |
| 2122420 | 1/1984 | United Kingdom | 257/329 |

OTHER PUBLICATIONS

Y. Baba, et al., *A Study on a High Blocking Voltage UMOS-FET with a Double Gate Structure*, Proceedings of 1992 International Symposium on Power Semiconductor Devices & ICs, pp. 300–302.

M. Bhatnagar and B. J. Baliga, *Analysis of Silicon Carbide Power Device Performance*, IEEE, 1991, pp. 176–180.

T. Syau, et al., *Extended Trench-Gate Power UMOS-FET Structure with Ultralow Specific On-Resistance*, Electronics Letters, vol. 28, No. 9, Apr., 1992 pp. 865–867.

Hiroo Fuma, et al., *High Temperature Operated Enhancement-Type β-SiC MOSFET*, Japanese Journal of Applied Physics, vol. 27, No. 11, Nov., 1988, pp. L2143–L2145.

*Primary Examiner*—Ngan Ngo
*Attorney, Agent, or Firm*—Bell, Seltzer, Park & Gibson

[57] ABSTRACT

A silicon carbide field effect device includes vertically stacked silicon carbide regions of first conductivity type, extending from a lowermost drain region to an uppermost source region. In between the drain and source regions, a drift region and a channel region are provided. The drift region extends adjacent the drain region and the channel region extends between the drift region and the source region. Control of majority carrier conduction between the source and drain regions is provided by a plurality of trenches, which extend through the source and channel region, and conductive gate electrodes therein. To provide high blocking voltage capability and low on-state resistance, the doping concentration in the drift region is selected to be greater than the doping concentration of the channel region but below the doping concentration of the drain and source regions. Preferably, the material used for the gate electrodes, the spacing between adjacent trenches and the doping concentration of the channel region are chosen so that the channel region is depleted of majority charge carriers when zero potential bias is applied to the gate electrodes.

24 Claims, 4 Drawing Sheets

SILICON CARBIDE FIELD EFFECT DEVICE

FIELD OF THE INVENTION

The present invention relates to microelectronic devices and more particularly to silicon carbide devices for high power applications.

BACKGROUND OF THE INVENTION

The silicon bipolar transistor has been the device of choice for high power applications in motor drive circuits, appliance controls, robotics and lighting ballasts. This is because bipolar transistors can be designed to handle relatively large current densities in the range of 40-50 A/cm$^2$ and support relatively high blocking voltages in the range of 500-1,000 V.

Despite the attractive power ratings achieved by bipolar transistors, there exist several fundamental drawbacks to their suitability for all high power applications. First of all, bipolar transistors are current controlled devices which require relatively large base currents, typically one fifth to one tenth of the collector current, to maintain the transistor in an operating mode. Proportionally larger base currents can be expected for applications which also require high speed turn-off. Because of the large base current demands, the base drive circuitry for controlling turn-on and turn-off is relatively complex and expensive. Bipolar transistors are also vulnerable to premature breakdown if a high current and high voltage are simultaneously applied to the device, as commonly required in inductive power circuit applications. Furthermore, it is relatively difficult to parallel connect bipolar transistors because current diversion to a single transistor typically occurs at high temperatures, making emitter ballasting schemes necessary.

The silicon power MOSFET was developed to address this base drive problem. In a power MOSFET, the gate electrode provides turn-on and turn-off control upon the application of an appropriate gate bias. For example, turn-on in an N-type enhancement MOSFET occurs when a conductive inversion layer is formed in the P-type channel region in response to the application of a positive gate bias. The inversion layer electrically connects the N-type source and drain regions. As will be understood by one skilled in the art, the length of the channel in a vertical power MOSFET is dependent on the rate of diffusion of the source and channel dopants in the silicon substrate. The length of the channel is an important design parameter because it has a strong influence on the MOSFET's on-resistance and transconductance.

The power MOSFET's gate electrode is separated from the channel region by an intervening insulating layer, typically silicon dioxide. Because the gate is insulated from the channel region, little if any gate current is required to maintain the MOSFET in a conductive state or to switch the MOSFET from an on-state to an off-state or vice-versa. The gate current is kept small during switching because the gate forms a capacitor with the MOSFET's channel region. Thus, only charging and discharging current ("displacement current") is required during switching. Because of the high input impedance associated with the insulated gate electrode, minimal current demands are placed on the gate and the gate drive circuitry can be easily implemented. Examples of known power MOSFETs such as the DMOSFET and UMOSFET structures of FIGS. 1 and 2 respectively, are described in a textbook by inventor Baliga, entitled *Modern Power Devices* (1987), beginning at Chapter 6, and an article by Syau, Venkatraman and inventor Baliga, entitled *Extended Trench-Gate Power UMOSFET Structure with Ultralow Specific On-Resistance*, published in Electronics Letters, Vol. 28, No. 9, pp. 865-867 (1992). However, both of these devices contain a P-N junction diode between the source and drain regions. As will be understood by those skilled in the art, the presence of a P-N junction can interfere with high frequency applications such as synchronous rectification because of the delay caused by minority carrier recombination when the MOSFET switches from the on-state to the off-state.

An example of a silicon power MOSFET for use in synchronous rectification applications is shown in FIG. 3. FIG. 3 is a reproduction of FIG. 4 from U.S. Pat. No. 4,903,189 to Ngo et al. and inventor Baliga, the disclosure of which is hereby incorporated herein by reference. This MOSFET 170, which includes trenches 178 at a face thereof and contains no P-N junctions, is commonly referred to as an accumulation-mode FET ("ACCU-FET") because turn-on is achieved by forming a conductive accumulation layer between the FET's source 186 and drain 182 regions. FIG. 3 shows a plurality of parallel connected ACCU-FET cells, each defined by mesas 179 and opposing trenches 178.

The ACCU-FET's on-state resistance is an important design parameter. The higher the on-state resistance, the higher the forward voltage drop and the higher the forward power losses. The on-state resistance of an ACCU-FET cell is dependent on the combined series resistance of the source, drift and drain regions. As will be understood by those skilled in the art, the series resistance of the drift region 184 includes the parallel contribution of each of the accumulation layers, which extend along opposing trench sidewalls when an appropriate polarity gate bias has been applied.

For an ACCU-FET of solely N-type conductivity, the width of the mesas and the drift region doping concentration can be chosen so that a potential barrier between the source 186 and drain 182 regions will be formed at zero potential gate bias. The potential barrier can be made sufficiently high to prevent conduction between the source and drain at relatively high blocking voltages. As will be understood by those skilled in the art, the ACCU-FET's maximum blocking voltage capability is a function of the height of the potential barrier between the source and drain and the thickness of the oxide 195 in the trench. Thicker oxides typically cause an increase in blocking voltage capability, however, thicker oxides result in higher forward conduction losses for a given gate bias. Blocking voltages of 50 Volts can be obtained with relatively low drift region 184 doping concentrations of $5 \times 10^{13}/cm^3$.

Higher blocking voltages can be expected with lower drift region doping concentrations. Unfortunately, attempts to increase the blocking voltage capability to above 50 Volts will typically eliminate the benefits of using an accumulation layer channel by making the on-state resistance in the drift region 184 too high. The silicon ACCU-FET of FIG. 3 can be designed for low forward power consumption by making the drift region doping concentration relatively high, but can be designed to support relatively high blocking voltages by making the drift region doping concentration relatively low. In other words, there is a competing tradeoff between designing for low forward power consumption and high blocking voltage capability.

Therefore, notwithstanding the recognized use of power MOSFETs for applications requiring high-speed turn-off and low gate-drive currents, there continues to be a need for a power MOSFET capable of sustaining high blocking voltages with low on-state resistance and which can be used for high frequency applications such as synchronous rectification and high power applications such as motor control.

SUMMARY OF THE INVENTION

It is therefore an object of the present invention to provide an improved field effect device for high frequency applications.

It is another object of the present invention to provide an improved field effect device for high power applications, having high blocking voltage capability and low on-state resistance.

These and other objects are provided, according to the present invention, by a silicon carbide field effect device, formed in a monocrystalline silicon carbide substrate having first and second opposing faces. The field effect device includes opposing silicon carbide source and drain regions and means for controlling the conduction of majority charge carriers between the source and drain regions using a plurality trenches in the substrate. The trenches are provided with insulating regions along the trench sidewalls and with conductive gate electrodes therein, on the insulating regions. By controlling the potential bias applied to the conductive gate electrodes, conduction between the silicon carbide source and drain regions can be controlled by the formation and removal of accumulation layer channels adjacent the sidewalls of the opposing trenches.

In addition, to achieve blocking voltages on the order of 250 Volts and higher, a silicon carbide drift region is provided adjacent the drain region, and a separate silicon carbide channel region is provided between the trenches and between the drift region and the source region. To simultaneously achieve a high blocking voltage and a low on-state resistance, the doping concentration in the silicon carbide channel region is made relatively low and the doping concentration in the silicon carbide drift region is preferably chosen to maintain the device's on-state resistance at a low value but still maintain the blocking voltage at a high value. Accordingly, the combined series resistance of the accumulation layer channels and the drift region is kept relatively low while the blocking voltage is kept relatively high by doping the channel region to a lower concentration than the drift region. By using silicon carbide and by partitioning the region between the source and drain into distinct drift and channel regions, and by doping the drift and channel regions to simultaneously achieve a high blocking voltage and a low on-state resistance, significant improvements in performance over the silicon ACCU-FET of FIG. 3 can be obtained.

More particularly, the field effect device of the present invention includes vertically stacked regions of first conductivity type, extending from a lowermost silicon carbide drain region of relatively high doping concentration at the first face to a uppermost silicon carbide source region of relatively high doping concentration at the second face. In between the drain and source regions are a silicon carbide drift region and a silicon carbide channel region thereon. The drift region is provided adjacent the drain region and is relatively lightly doped in comparison to the drain region. The channel region is provided between the drift region and the source region and is typically more lightly doped than the drift region. A plurality of trenches are also formed in the substrate at the second face. The trenches preferably extend through the channel region to the drift region. Accordingly, adjacent trenches define a plurality of silicon carbide mesas, extending between the drift region and the source region.

Insulating regions are also formed adjacent the trench sidewalls and conductive gate electrodes fill the remaining portions of each trench. The insulating regions electrically isolate each mesa from the conductive gate electrodes. The trenches can be formed by first selectively amorphizing adjacent portions of a monocrystalline silicon carbide substrate to define amorphous silicon carbide regions where the trenches are to be formed. The amorphizing step is then followed by a step for removing the amorphous silicon carbide regions from the silicon carbide substrate to define the trenches.

In one embodiment, source and drain contacts are provided on the respective source and drain regions to form a three terminal silicon carbide field effect transistor for synchronous rectification applications. However, the conductive gate electrodes can be electrically connected to each other and to the source contact to form a two terminal silicon carbide rectifier. Therefore, for a silicon carbide field effect device of N-type conductivity, the application of a positive bias to the conductive gate electrodes causes the formation of accumulation layer channels in the mesa adjacent the trench sidewalls. As will be understood by those skilled in the art, the accumulation layer channels provide an electrical "short" or low resistance path in the mesa, extending between the relatively highly doped silicon carbide source region and the silicon carbide drift region. For low on-state resistance, the silicon carbide drift region has a doping concentration above that of the silicon carbide channel region, and for high blocking voltage potential, the channel region has a doping concentration below that of the drift region. Alternatively, the application of either a zero or negative bias removes the accumulation layer channel and causes the depletion of majority charge carriers from the mesa and drift region. The depletion of majority carriers from the channel region causes the formation of a potential barrier between the source and drain. This potential barrier prevents majority carriers from traversing the channel region and thereby provides the blocking voltage capability.

In a preferred embodiment, the material (e.g. metal or polycrystalline silicon) used to form the conductive gate electrodes, the doping concentration of the silicon carbide channel region and the width of the mesas are chosen so that the difference in work function potentials between the gate electrodes ($\Psi_{gate}$) and the channel region ($\Psi_{channel}$) causes the complete depletion of the mesa, even when zero potential bias is applied to the gate electrodes. Accordingly, the application of a negative bias to the gate electrodes is not required to prevent conduction between the source region and the drain region at relatively low blocking voltages.

DESCRIPTION OF PREFERRED EMBODIMENTS

Figure 1:
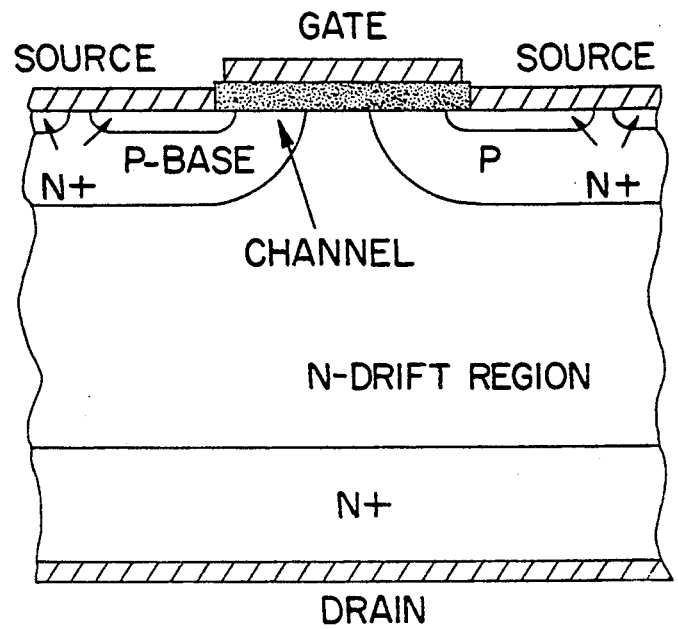
FIG. 1 illustrates a cross-sectional representation of a prior art silicon power DMOSFET.
Figure 2:
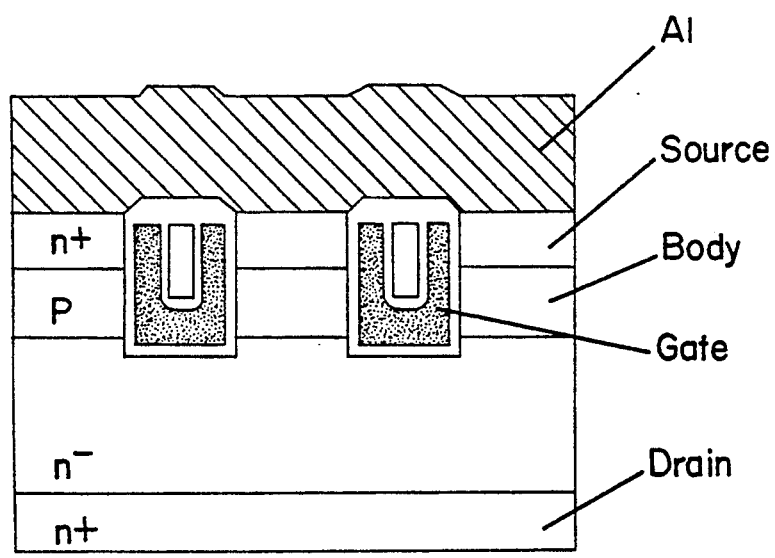
FIG. 2 illustrates a cross-sectional representation of a prior art silicon power UMOSFET.
Figure 3:
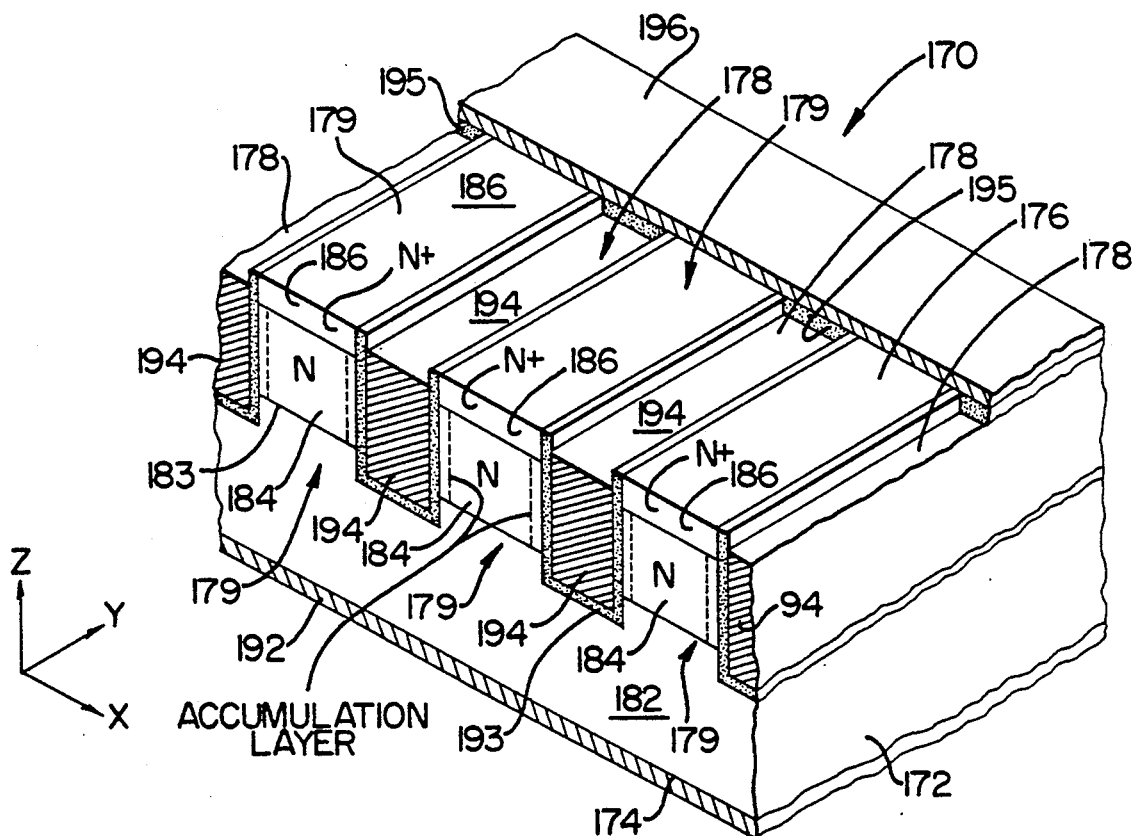
FIG. 3 illustrates a cross-sectional representation of a prior art silicon ACCUFET.

The present invention now will be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout.

Figure 4:
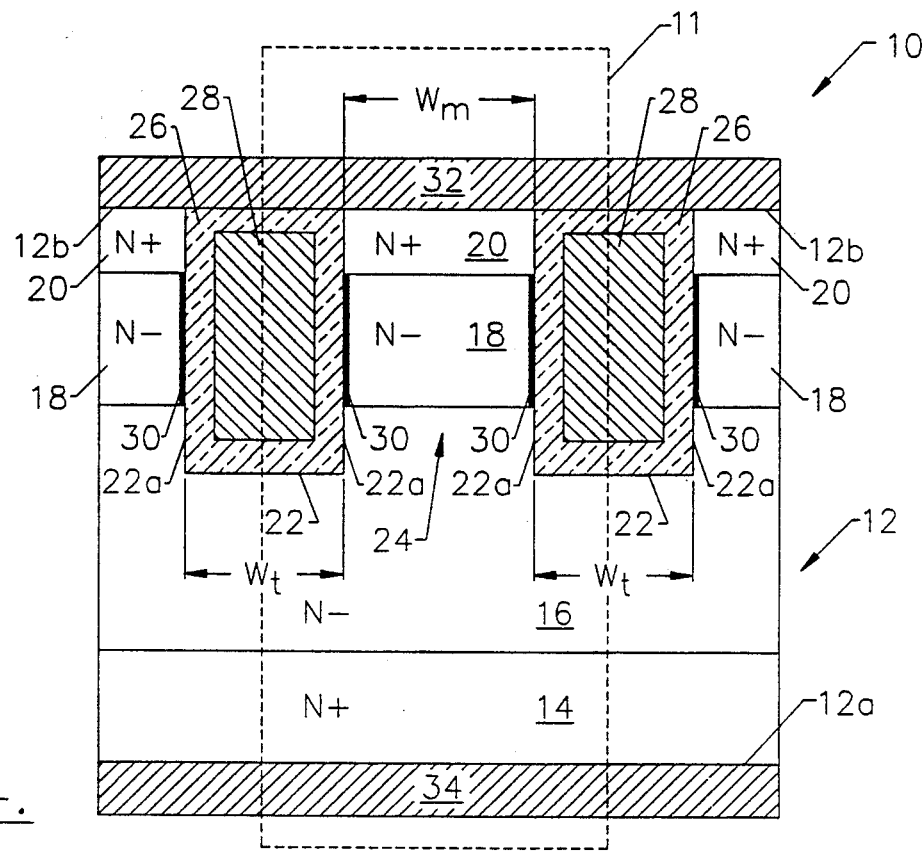
FIG. 4 illustrates a cross-sectional representation of a silicon carbide field effect device according to one embodiment of the present invention.

Referring now to FIG. 4, a cross-sectional illustration of a silicon carbide field effect device according to one embodiment of the present invention is shown. The field effect device 10 preferably comprises a plurality of adjacent unit cells 11 in a silicon carbide substrate 12 of first conductivity type, typically N-type conductivity. The silicon carbide substrate 12 has a first face 12a and a second opposing face 12b and preferably comprises a relatively highly doped silicon carbide drain region 14 (shown as N+), adjacent the first face 12a. A silicon carbide drift region 16 of first conductivity type (shown as N) is provided on the drain region 14, opposite the first face 12a. A relatively highly doped silicon carbide source region 20 (shown as N+) extends adjacent the second face 12b. A silicon carbide channel region 18 (shown as N−) is also provided between the source region 20 and the drift region 16. Preferably, the channel region 18 has a doping concentration below that of the drift region 16. Alternatively, the doping concentration in the drift region 16 and channel region 18 can be made the same. A suitable N-type dopant in silicon carbide is nitrogen.

A plurality of trenches 22 having width ($W_t$) are also formed in the substrate 12. The trenches 22 may be patterned as stripes extending in a third dimension (not shown) or may be rectangular or of similar pattern. Each trench includes a sidewall 22a, extending between the drift region 16 and the source region 20. Adjacent trenches 22 define a mesa 24, which includes the channel and source regions 18, 20, respectively. Each trench 22 also includes insulating regions 26 along the trench sidewalls 22a and trench bottoms. Conductive gate electrodes 28 are also provided in the trenches 22. The conductive gate electrodes 28 typically comprise a metal such as Aluminum or polycrystalline silicon.

The trenches 22 can be formed in the substrate 12 by first amorphizing those portions of the substrate where the trenches are to be formed and then removing the amorphized portions to expose the trenches 22. The steps for amorphizing silicon carbide preferably include the steps of forming a mask on the face 12b of a monocrystalline silicon carbide substrate 12 and exposing an area on the face 12b corresponding to those portions of the substrate where the trenches are to be formed. Thereafter, ions are directed to the face 12b such that the ions implant into the substrate through the exposed areas and convert the exposed regions of the substrate into amorphous silicon carbide regions. The amorphous silicon carbide regions can then be removed by etching the substrate 12 using such etchants as $HF_2$ or $HF+HNO_3$. The above-described steps for forming trenches in monocrystalline silicon carbide are described in a co-pending, commonly-assigned application entitled, "Method for Forming Trenches in Monocrystalline Silicon Carbide," Ser. No. 08/008,719, filed Jan. 25, 1993, the disclosure of which is hereby incorporated herein by reference.

As will be understood by those skilled in the art, the application of a positive gate bias relative to the drain region 14 causes the formation of N-type accumulation layer channels 30 in the channel region 18, adjacent the trench sidewalls 22a. These accumulation layer channels 30 provide a highly conductive path for majority carriers, between the source region 20 and drift region 16. Source and drain contacts, 32 and 34 respectively, are also provided for ohmically contacting the source and drain regions. In addition, electrical contact to the gate electrodes 28 is made by opening vias in the source contact 32 and insulating regions 26 in a third dimension.

Figure 6:
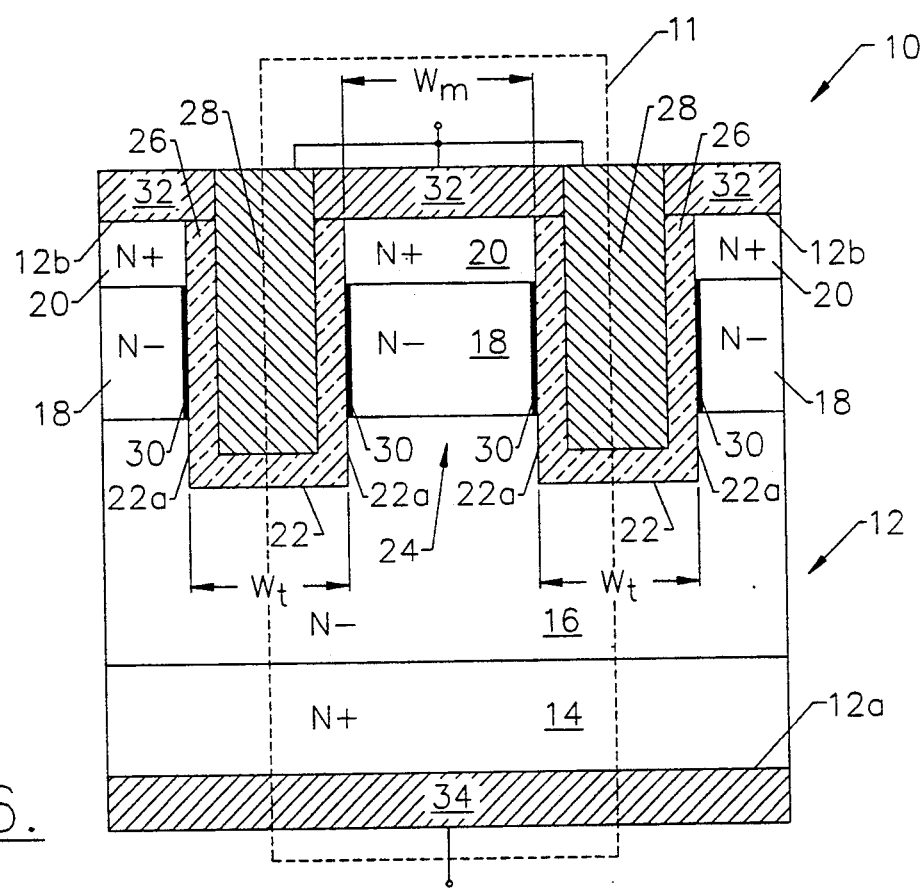
FIG. 6 illustrates a cross-sectional representation of a silicon carbide rectifier according to a third embodiment of the present invention.

The silicon carbide field effect device can comprise a three terminal field effect transistor by providing separate source and drain contacts and by electrically connecting the conductive gate electrodes 28 together. The three terminal field effect transistor can be used as a synchronous rectifier by synchronously applying a bias to the gate electrodes and an appropriate polarity bias across the device. The conductive gate electrodes 28 can also be electrically connected to the source contact 32 to provide a two-terminal rectifier, as shown in FIG. 6. In the rectifier embodiment, the application of a positive bias to the source contact 33 causes the conduction of majority carriers from the drift region 16 to the source region 20, via the accumulation layer channels 30.

The application of either a zero or negative bias causes the depletion of majority charge carriers from the mesas 24 and also from the drift region 16. Preferably, the conductive gate electrodes, the doping concentration of the channel region and the width of the mesas ($W_m$) are chosen so that the difference in work function potentials between the gate electrodes ($\Psi_{gate}$) and the channel region ($\Psi_{channel}$) causes a complete depletion of the mesa, even with zero potential bias being applied to the gate electrodes. Accordingly, the application of a negative bias to the gate electrodes is not required to prevent conduction between the source region and the drain region at relatively low blocking voltages. The difference in work function potential between the gate electrode 28 and adjacent channel region 18 (i.e., $\Psi_{gc}$) can be computed using the following equation:

$$\Psi_{gc} = \Psi_{gate} - \left(\chi + \frac{E_g}{2q} - \psi_B\right) \quad (1)$$

where: $\chi$ is the electron affinity, $E_g$ is the bandgap, and $\Psi_B$ is the potential difference between the Fermi level and intrinsic Fermi level, for silicon carbide in the channel region. $\Psi_B$ is a function of the doping concentration in the channel region 18. As will be understood by those skilled in the art, the greater the width of the mesa, the greater the work function difference must be to fully deplete the mesa region and provided blocking at zero gate bias. However, the application of a negative gate bias will improve the device's blocking voltage capability by extending the depletion region into the drift region.

Two-dimensional simulations of the device of FIG. 4 reveal a blocking voltage of 500 volts can be obtained for a silicon carbide device having the parameters as set forth in Table 1.

TABLE 1

| Region | Composition | $N_D$ | Thickness/ Depth | Width (Unit Cell) |
|---|---|---|---|---|
| 14 Drain | SiC | $2 \times 10^{18}$ | 200 microns | 2 microns |
| 16 Drift | SiC | $5 \times 10^{16}$ | 5 microns | 2 microns |
| 18 Channel | SiC | $1 \times 10^{14}$ | 3 microns | 1 micron |
| 20 Source | SiC | $1 \times 10^{19}$ | 1 micron | 1 micron |
| 22 Trench | — | — | 3 microns | 1 micron |
| 24 Mesa | SiC | — | 3 microns | 1 micron |
| 26 Insulating | SiO$_2$ | — | 1000 Å | — |
| 28 Gate | Poly-Si | $\sim 1 \times 10^{19}$ | — | — |
| 32 Source Contract | Metal | — | 1 micron | — |
| 34 Drain Contract | Metal | — | 1 micron | — |

Figure 5:
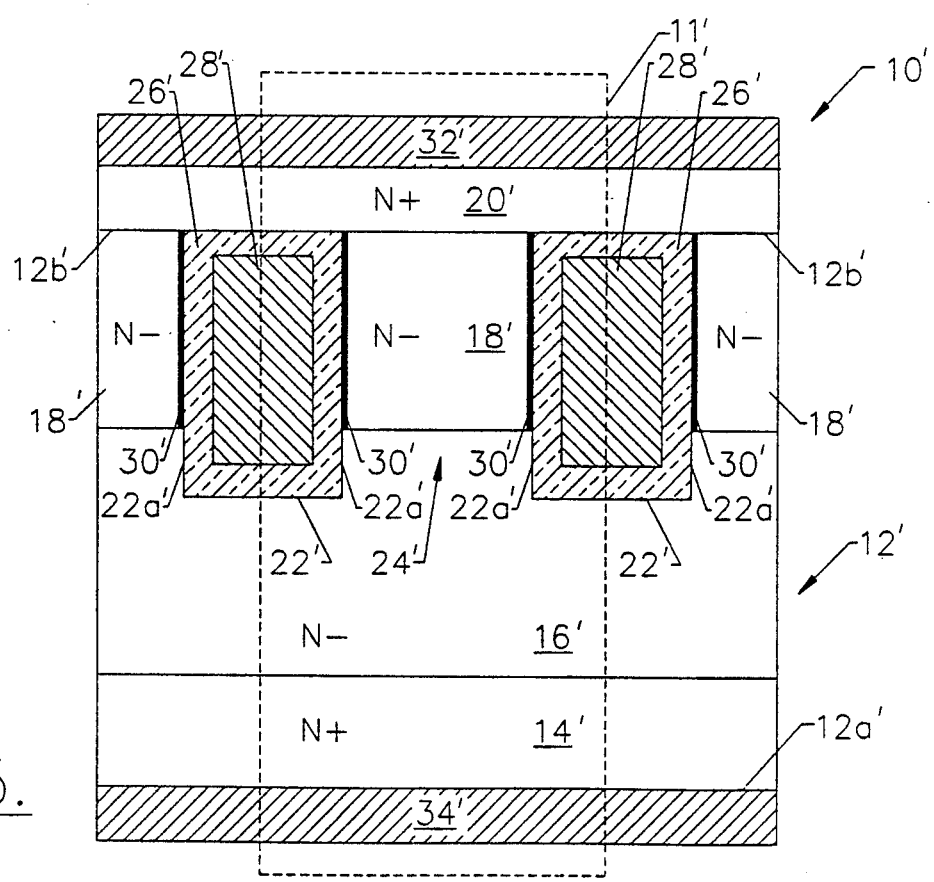
FIG. 5 illustrates a cross-sectional representation of a silicon carbide field effect device according to another embodiment of the present invention.

Referring now to FIG. 5, a cross-sectional illustration of a silicon carbide field effect device 10' according to another embodiment of the present invention is shown. This embodiment is essentially identical to the embodiment of FIG. 4 as indicated by the prime (') notation, however the silicon carbide source region 20' is formed as a continuous layer on the second face 12b'. Accordingly, the mesas 24' which are formed between adjacent trenches 22' do not include the source region 20'.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed:

1. A silicon carbide field effect transistor comprising:
 a silicon carbide substrate having first and second opposing faces;
 a silicon carbide drain region of first conductivity type in said silicon carbide substrate, extending to said first face;
 a silicon carbide drift region of first conductivity type on said silicon carbide drain region opposite said first face, said silicon carbide drift region having a first conductivity type dopant concentration below that of said silicon carbide drain region;
 a silicon carbide channel region of first conductivity type on said silicon carbide drift region opposite said silicon carbide drain region, said silicon carbide channel region having a first conductivity type dopant concentration below that of said silicon carbide drift region;
 a silicon carbide source region of first conductivity type on said silicon carbide channel region, said silicon carbide source region extending to said second face and having a first conductivity type dopant concentration above that of said silicon carbide channel region;
 a first trench in said silicon carbide substrate at said second face, said first trench having a sidewall extending between said silicon carbide drift region and said silicon carbide source region; and
 a second trench in said silicon carbide substrate at said second face, adjacent said first trench, said second trench having a sidewall extending between said silicon carbide drift region and said silicon carbide source region to thereby define a mesa of first conductivity type in said silicon carbide channel region and said silicon carbide source region, between said first trench and said second trench.

2. The silicon carbide field effect transistor of claim 1, further comprising a first insulating region on said first trench sidewall and a second insulating region on said second trench sidewall.

3. The silicon carbide field effect transistor of claim 2, further comprising a first conductive gate electrode in said first trench on said first insulating region and a second conductive gate electrode in said second trench on said second insulating region.

4. The silicon carbide field effect transistor of claim 3, wherein said first trench has a bottom adjacent said silicon carbide drift region and said second trench has a bottom adjacent said silicon carbide drift region, and wherein said first insulating region extends along said first trench bottom and said second insulating region extends along said second trench bottom.

5. The silicon carbide field effect transistor of claim 3, wherein said first conductive gate electrode has a first work function potential, and said second conductive gate electrode has a second work function potential and said silicon carbide channel region has a third work function potential, and wherein said first, second and third work function potentials are selected to deplete mobile charge carriers of first conductivity type from said silicon carbide channel region.

6. The silicon carbide field effect transistor of claim 5, wherein said first, second and third work function potentials are selected to fully deplete mobile charge carriers of first conductivity type from said silicon carbide channel region.

7. The silicon carbide field effect transistor of claim 5, wherein said first, second and third work function potentials are selected to fully deplete mobile charge carriers of first conductivity type from said mesa when said first conductive gate electrode and said second conductive gate electrode are both at zero potential bias, with respect to said silicon carbide drain region.

8. The silicon carbide field effect transistor of claim 4, wherein said silicon carbide channel region comprises monocrystalline silicon carbide and wherein said first trench and said second trench are formed by simultaneously amorphizing adjacent portions of said monocrystalline silicon carbide channel region to define adjacent amorphous silicon carbide regions and then removing the amorphous silicon carbide regions.

9. A silicon carbide field effect transistor comprising:
a silicon carbide substrate having first and second opposing faces;
a silicon carbide drain region of first conductivity type in said silicon carbide substrate, extending to said first face;
a silicon carbide drift region of first conductivity type on said silicon carbide drain region opposite said first face, said silicon carbide drift region having a first conductivity type dopant concentration below that of said silicon carbide drain region;
a silicon carbide channel region of predetermined conductivity type on said silicon carbide drift region opposite said silicon carbide drain region, said silicon carbide channel region having a first conductivity type dopant concentration below that of said silicon carbide drift region;
a silicon carbide source region of first conductivity type on said silicon carbide channel region, said silicon carbide source region extending to said second face and having a first conductivity type dopant concentration above that of said silicon carbide channel region; and
at least one trench in said silicon carbide substrate at said second face, said trench extending between said second face and said silicon carbide drift region and having a sidewall which defines a mesa, extending between said silicon carbide drift region and said second face.

10. The silicon carbide field effect transistor of claim 9, further comprising an insulating region on said trench sidewall.

11. The silicon carbide field effect transistor of claim 10, further comprising a conductive gate electrode in said trench, extending along said insulating region.

12. The silicon carbide field effect transistor of claim 11, wherein said conductive gate electrode has a first work function potential and said silicon carbide channel region has a second work function potential, and wherein a difference between said first work function potential and said second work function potential is preselected to deplete mobile charge carriers of first conductivity type from said silicon carbide channel region.

13. The silicon carbide field effect transistor of claim 12, wherein said difference is preselected to fully deplete mobile charge carriers of first conductivity type from said silicon carbide channel region when said conductive gate electrode is at zero potential bias, with respect to said silicon carbide drain region.

14. The silicon carbide field effect transistor of claim 11, wherein said silicon carbide channel region comprises monocrystalline silicon carbide and wherein said trench is formed by amorphizing a portion of said silicon carbide substrate to define an amorphous silicon carbide region and then removing the amorphous silicon carbide region to define said mesa.

15. A silicon carbide field effect transistor comprising:
a silicon carbide substrate having first and second opposing faces;
a silicon carbide drain region of first conductivity type in said silicon carbide substrate, extending to said first face;
a silicon carbide drift region of first conductivity type on said silicon carbide drain region opposite said first face, said silicon carbide drift region having a first conductivity type dopant concentration below that of said silicon carbide drain region;
a silicon carbide channel region of first conductivity type on said silicon carbide drift region opposite said silicon carbide drain region, said silicon carbide channel region extending to said second face and having a first conductivity type dopant concentration below that of said silicon carbide drift region;
a first trench in said silicon carbide substrate at said second face, said first trench having a first sidewall extending between said silicon carbide drift region and said second face; and
a second trench in said silicon carbide substrate at said second face, adjacent said first trench, said second trench having a second sidewall, opposite said first trench sidewall, extending between said silicon carbide drift region and said second face.

16. The silicon carbide field effect transistor of claim 15, further comprising a first insulating region on said first trench sidewall and a second insulating region on said second trench sidewall.

17. The silicon carbide field effect transistor of claim 16, further comprising a first conductive gate electrode in said first trench on said first insulating region and a second conductive gate electrode in said second trench on said second insulating region.

18. The silicon carbide field effect transistor of claim 17, wherein said first conductive gate electrode has a first work function potential, and said second conductive gate electrode has a second work function potential and said silicon carbide channel region has a third work function potential, and wherein said first, second and third work function potentials are selected to deplete mobile charge carriers of first conductivity type from said silicon carbide channel region.

19. The silicon carbide field effect transistor of claim 18, wherein said first, second and third work function potentials are selected to fully deplete mobile charge carriers of first conductivity type from said silicon carbide channel region when said first conductive gate electrode and said second conductive gate electrode are both at zero potential bias, with respect to said silicon carbide drain region.

20. The silicon carbide field effect transistor of claim 18, further comprising a silicon carbide source region of first conductivity type on said second face, electrically contacting said silicon carbide channel region, said silicon carbide source region having a first conductivity type dopant concentration above that of said silicon carbide channel region.

21. The silicon carbide field effect transistor of claim 20, further comprising a drain contact on said silicon carbide drain region, opposite said first face, and a source contact on said silicon carbide source region, opposite said second face.

22. A silicon carbide rectifier, comprising:
a monocrystalline silicon carbide substrate having first and second opposing faces;
a silicon carbide drain region of first conductivity type in said silicon carbide substrate, extending to said first face;
a silicon carbide drift region of first conductivity type on said silicon carbide drain region opposite said first face, said silicon carbide drift region having a first conductivity type dopant concentration below that of said silicon carbide drain region;

a silicon carbide channel region of first conductivity type on said silicon carbide drift region opposite said silicon carbide drain region, said silicon carbide channel region having a first conductivity type dopant concentration below that of said silicon carbide drift region;

a silicon carbide source region of first conductivity type on said silicon carbide channel region, said silicon carbide source region extending to said second face and having a first conductivity type dopant concentration above that of said silicon carbide channel region;

a first trench in said silicon carbide substrate at said second face, said first trench having a sidewall extending between said silicon carbide drift region and said silicon carbide source region;

a second trench in said silicon carbide substrate at said second face, adjacent said first trench, said second trench having a sidewall extending between said silicon carbide drift region and said silicon carbide source region to thereby define a mesa of first conductivity type in said silicon carbide channel region and said silicon carbide source region, between said first trench and said second trench;

a first insulating region on said first trench sidewall and a second insulating region on said second trench sidewall;

a first conductive gate electrode in said first trench on said first insulating region and a second conductive gate electrode in said second trench on said second insulating region;

a drain contact on said silicon carbide drain region, at said first face; and a source contact on said silicon carbide source region, at said second face, said source contact electrically connected to said first conductive gate electrode and said second conductive gate electrode.

23. The silicon carbide rectifier of claim 22, wherein said first conductive gate electrode has a first work function potential, and said second conductive gate electrode has a second work function potential and said silicon carbide channel region has a third work function potential, and wherein said first, second and third work function potentials are selected to fully deplete mobile charge carriers of first conductivity type from said silicon carbide channel region, when said source contact is at zero potential bias, with respect to said drain contact.

24. The silicon carbide rectifier of claim 23, wherein said first trench and said second trench are formed by simultaneously amorphizing adjacent portions of said monocrystalline silicon carbide channel region to define adjacent amorphous silicon carbide regions and then removing the amorphous silicon carbide regions to define said mesa.

* * * * *